(12) United States Patent
Tomiha

(10) Patent No.: US 11,550,006 B2
(45) Date of Patent: Jan. 10, 2023

(54) MAGNETIC RESONANCE IMAGING APPARATUS

(71) Applicant: Canon Medical Systems Corporation, Otawara (JP)

(72) Inventor: Sadanori Tomiha, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 16 days.

(21) Appl. No.: 16/676,504

(22) Filed: Nov. 7, 2019

(65) Prior Publication Data

US 2020/0150198 A1 May 14, 2020

(30) Foreign Application Priority Data

Nov. 8, 2018 (JP) .............................. JP2018-210419
Nov. 6, 2019 (JP) .............................. JP2019-201304

(51) Int. Cl.
*G01R 33/28* (2006.01)
*G01R 33/31* (2006.01)

(52) U.S. Cl.
CPC ........... *G01R 33/288* (2013.01); *G01R 33/31* (2013.01)

(58) Field of Classification Search
CPC ...... G01R 33/288; G01R 33/31; G01R 33/28; G01R 33/34; G01R 33/543
See application file for complete search history.

(56) References Cited

U.S. PATENT DOCUMENTS

| 5,209,233 | A | * | 5/1993 | Holland | ............. | G01R 33/5673 |
| | | | | | | 600/412 |
| 2005/0197077 | A1 | * | 9/2005 | Bielmeier | ............ | G01R 33/543 |
| | | | | | | 455/115.1 |
| 2016/0291103 | A1 | * | 10/2016 | Van Leeuwen | .... | G01R 33/3804 |
| 2018/0321341 | A1 | * | 11/2018 | Biber | ................. | G01R 33/3692 |
| 2019/0056465 | A1 | * | 2/2019 | Schnetter | ............ | G01R 33/288 |

OTHER PUBLICATIONS

Health Protection Agency. Protection of patients and volunteers undergoing MRI procedures. Documents of the Health Protection Agency Radiation, Chemical and Environmental Hazards, Aug. 2008. (Year: 2008).*

The International Electrotechnical Commission "International Standards" Edition 3.0. Year: 2010. pp. 34-37. (Year: 2010).*

* cited by examiner

*Primary Examiner* — Rishi R Patel
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry acquires an ambient temperature relating to a magnetic resonance imaging examination and determines an interlock value of a specific absorption rate (SAR) in accordance with the ambient temperature.

9 Claims, 4 Drawing Sheets

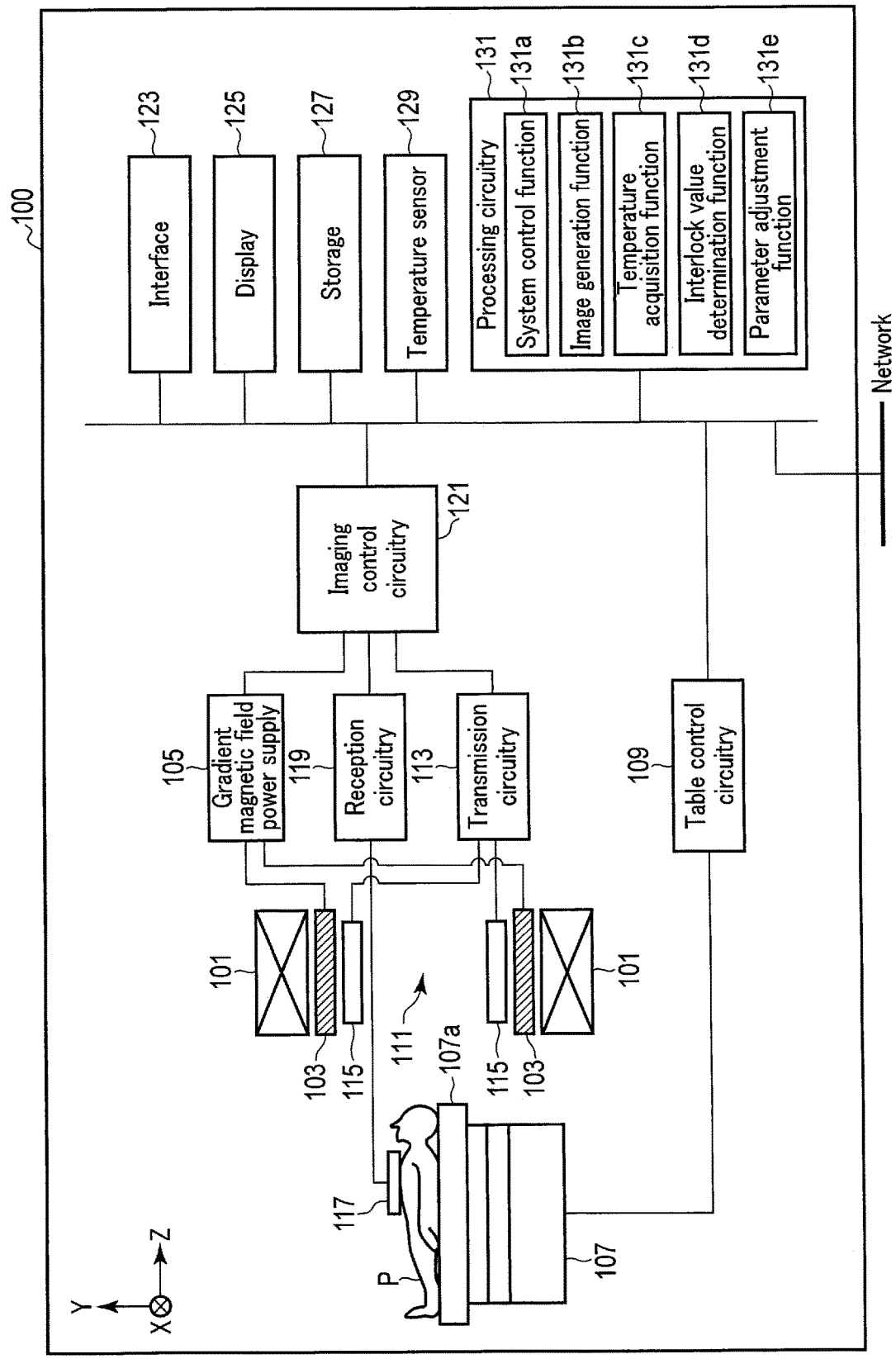
F I G. 1

MAGNETIC RESONANCE IMAGING APPARATUS

CROSS-REFERENCE TO RELATED APPLICATIONS

This application is based upon and claims the benefit of priority from Japanese Patent Applications No. 2018-210419, filed Nov. 8, 2018, and No. 2019-201304, filed Nov. 6, 2019. The entire contents of both applications are incorporated herein by reference.

FIELD

Embodiments described herein relate generally to a magnetic resonance imaging apparatus.

BACKGROUND

To obtain a magnetic resonance image, a magnetic resonance imaging (MRI) apparatus irradiates a to-be-imaged section of a subject with radio frequency (RF) pulses, which serve as a high-frequency magnetic field. The RF pulses are absorbed into the body tissue of the subject, thereby increasing the temperature of the subject. The indicator of the energy of the RF pulses absorbed into the subject's body tissue is expressed in the form of a specific absorption rate (SAR).

The value of SAR is limited by an upper limit that is specified by the standards of the International Electrotechnical Commission (IEC) or the like. For this reason, in conventional MRI apparatuses, an interlock value lower than the upper limit of the SAR is set irrespective of the ambient temperature.

BRIEF DESCRIPTION OF THE DRAWINGS

FIG. 1 is a diagram showing an exemplary configuration of an MRI apparatus according to the first embodiment.

DETAILED DESCRIPTION

Figure 2:
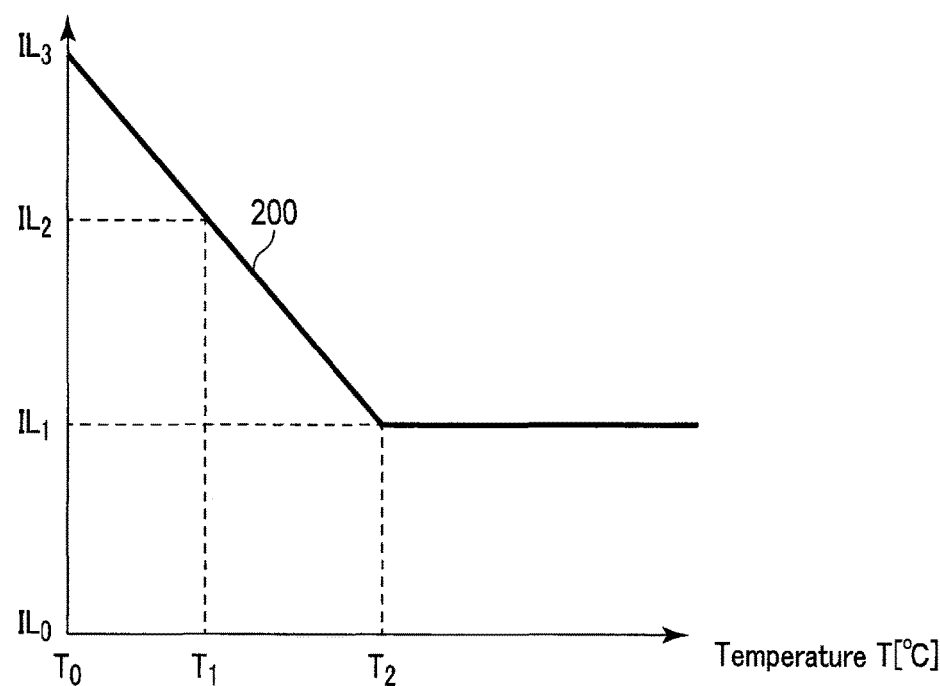
FIG. 2 is a graph showing an example of a relationship between the temperature and the interlock value according to the first embodiment.

In general, according to one embodiment, a magnetic resonance imaging apparatus includes processing circuitry. The processing circuitry acquires an ambient temperature relating to a magnetic resonance imaging examination and determines an interlock value of a specific absorption rate (SAR) in accordance with the ambient temperature.

The embodiments of the magnetic resonance imaging apparatus will be described in detail below, with reference to the drawings.

First Embodiment

FIG. 1 is a diagram showing an exemplary configuration of an MRI apparatus according to the first embodiment. As illustrated in FIG. 1, an MRI apparatus 100 according to the embodiment is provided, for example, with a static field magnet 101, a gradient coil 103, a gradient magnetic field power supply 105, a table 107, table control circuitry 109, transmission circuitry 113, a transmission coil 115, a reception coil 117, reception circuitry 119, imaging control circuitry 121, an interface 123, a display 125, a storage 127, a temperature sensor 129, and processing circuitry 131. The MRI apparatus 100 may include a cylindrical, hollowed shim coil between the static field magnet 101 and gradient coil 103.

The static field magnet 101 is formed into an approximately cylindrical, hollowed shape. The static field magnet 101 generates a uniform static magnetic field inside the bore 111, into which the subject P is transported. As the static field magnet 101, a superconducting magnet may be adopted.

The gradient coil 103 is formed into an approximately cylindrical, hollowed shape, and arranged inside the static field magnet 101. The gradient coil 103 is formed by combining three coils corresponding to the X, Y, and Z axes that are orthogonal to each other. The Z-axis direction runs in the same direction as that of the static magnetic field. The Y-axis direction is the vertical direction, and the X-axis direction is perpendicular to the Z-axis and Y-axis directions. The gradient coil 103 generates a gradient magnetic field to be superposed upon the static magnetic field. Specifically, the three coils of the gradient coil 103 individually receive a current supplied from the gradient magnetic field power supply 105, and thereby each generate a gradient magnetic field, the magnetic intensity of which varies along the X, Y, and Z axes.

The gradient magnetic fields generated along the X, Y, and Z axes by the gradient coil 103 may form a frequency encoding gradient magnetic field (also referred to as a "read-out gradient magnetic field"), a phase encoding gradient magnetic field, and a slice selection gradient magnetic field. The frequency encoding gradient magnetic field is used for changing the frequency of a magnetic resonance (hereinafter referred to as "MR") signal in accordance with the spatial position. The phase encoding gradient magnetic field is used for changing the phase of the MR signal in accordance with the spatial position. The slice selection gradient magnetic field is used for determining an imaging slice.

The gradient magnetic field power supply 105 is a power supply device that supplies a current to the gradient coil 103 under the control of the imaging control circuitry 121.

The table 107 is a device that includes a table top 107a, on which a subject P lies. Under the control of the table control circuitry 109, the table 107 inserts the table top 107a with the subject P carried thereon into the bore 111. The table 107 may be installed in an examination room in which the MRI apparatus 100 is installed in such a manner that the longitudinal direction of the table 107 runs parallel to the center axis of the static field magnet 101. The examination room, in which radio shielding and magnetic shielding is provided, is also referred to as a "shielded room".

The table control circuitry 109 controls the table 107. By driving the table 107 in accordance with the user's instructions via the interface 123, the table control circuitry 109 moves the table top 107a in the longitudinal direction and vertical direction, and if needed, also in the side-to-side direction.

The transmission circuitry 113 supplies a high frequency pulse corresponding to the Larmor frequency to the transmission coil 115 under the control of the imaging control circuitry 121.

The transmission coil 115 is a radio frequency (RF) coil arranged inside the gradient coil 103. The transmission coil 115 receives a high frequency pulse supplied from the transmission circuitry 113, and thereby generates a high-frequency magnetic field. The transmission coil may be a whole body coil (WB coil). The WB coil may be used as a transmission/reception coil.

The reception coil 117 is an RF coil arranged inside the gradient coil 103. The reception coil 117 receives an MR signal released from the subject P in the high-frequency magnetic field, and outputs the received MR signal to the reception circuitry 119. The reception coil 117 includes one or more coils, and is typically a coil array that includes a plurality of coil elements. In FIG. 1, the transmission coil 115 and the reception coil 117 are illustrated as separate RF coils. However, the transmission coil 115 and the reception coil 117 may be realized as an integrated transmission/reception coil. The transmission/reception coil may be a local RF coil such as a head coil.

Under the control of the imaging control circuitry 121, the reception circuitry 119 generates a digital MR signal that is the digitized complex data, based on the MR signal output from the reception coil 117. In particular, the reception circuitry 119 implements various signal processes on the MR signal output from the reception coil 117, and thereafter executes an analog-to-digital (A/D) conversion on the data that has been subjected to the signal processes. By sampling the A/D converted data, the reception circuitry 119 generates a digital MR signal (hereinafter referred to as "MR data"). The reception circuitry 119 outputs the generated MR data to the imaging control circuitry 121.

The imaging control circuitry 121 controls the gradient magnetic field power supply 105, the transmission circuitry 113 and the reception circuitry 119 in accordance with an imaging protocol output from the processing circuitry 131, to perform imaging of the subject P. The imaging protocol includes various pulse sequences corresponding to an examination. The imaging protocol defines the magnitude of the current supplied from the gradient magnetic field power supply 105 to the gradient coil 103, the timing of the current supply from the gradient magnetic field power supply 105 to the gradient coil 103, the magnitude of the high frequency pulse supplied from the transmission circuitry 113 to the transmission coil 115, the timing of the high frequency pulse supply from the transmission circuitry 113 to the transmission coil 115, the timing of the MR signal reception at the reception coil 117, and the like. The imaging control circuitry 121 is an example of the imaging unit.

The interface 123 includes a circuit that receives various instructions and information input by the user. The interface 123 may include a circuit that relates to a pointing device such as a mouse, or an input device such as a keyboard. The circuit included in the interface 123 is not limited to circuits relating to physical components for operation, such as a mouse and keyboard. The interface 123 may be, for example, provided with electric signal processing circuitry for receiving electric signals which correspond to an input operation from an external input device arranged separately from the MRI apparatus 100, and outputting the received electric signals to various other circuits.

Under the control of the processing circuitry 131 through the system control function 131a, the display 125 displays various MR images generated through the image generation function 131b and various items of information relating to the imaging and image processing. The display 125 may be a device such as a CRT display, liquid crystal display, organic EL display, LED display, plasma display, or any other display, or a monitor known in the field of the technology.

The storage 127 stores the MR data to fill the k-space through the image generation function 131b, and the image data generated through the image generation function 131b. The storage 127 also stores various imaging protocols and imaging conditions including a plurality of imaging parameters that define the imaging protocols. The imaging conditions may include to-be-imaged sections and sequence types. The to-be-imaged sections may include the head, heart, spine (e.g. thoracolumbar spine and total spine) and joints (shoulder, knee, arm and leg). The sequence types may include spin echo, gradient echo, fast spin echo, fast gradient echo, and echo planar imaging (EPI). The storage 127 stores programs corresponding to various functions implemented by the processing circuitry 131.

The storage 127 further stores a correspondence table that represents the relationship between the temperature relating to the MRI examination and the interlock value of the MRI apparatus 100, to be discussed later. As an interlock value, the value of SAR (W/kg) may be adopted. As the SAR value, the value of the whole-body SAR or the value of the SAR of a specific section of a human body, such as a head section and body section, may be adopted. In addition, a SAR-related value of a specific position or region in which the value tends to increase may be adopted. As an interlock value, an upper limit (hereinafter referred to as "upper setting limit") for setting the SAR-related imaging parameter (e.g., RF pulse-related parameters based on the SAR value) may be adopted. If the interlock value denotes the upper setting limit, the correspondence table describes the relationship between the temperature and the upper setting value. A look-up table may be adopted as the correspondence table. Instead of the correspondence table, the storage 127 may store mathematical formulae showing the function for determining the interlock value by using the temperature as a variable. In the specification, the "SAR-related interlock value" may be interpreted as the "interlock value of the SAR".

The SAR value may be a predicted value or a measured value. The predicted value is a value calculated by the processing circuitry 131 based on the pulse sequence information. In particular, the predicted value may be an average protocol obtained by averaging the total of SARs for different sequences of a protocol. The measured value is a value calculated based on the reflection wave reflected at the output end of the WB coil, for example, from among the high frequency pulses from the transmission circuitry 113 to the transmission coil 115 (e.g., WB coil). Specifically, the measured value may be obtained by dividing the 10-second average value, 6-minute average value, and real-time measured value by the given time length (e.g., 10 seconds and 6 minutes).

FIG. 2 is a graph showing an example of a relationship between the temperature and the interlock value according to the first embodiment. As indicated in FIG. 2, the horizontal axis of the graph 200 denotes the temperature T[° C.], while the vertical axis of the graph 200 denotes the interlock value IL [W/kg]. The graph 200 decreases linearly from the interlock value $IL_3$ to the interlock value $IL_1$ between the temperature $T_0$ and the temperature $T_2$. For the temperature range of the temperature $T_2$ and above, the graph 200 stays constant at the interlock value $IL_1$. If temperature $T_1$ is defined between the temperature $T_0$ and the temperature $T_2$, the graph 200 may be defined such that the rate of the change of the interlock value between the temperature $T_0$ and the temperature $T_1$ differs from the rate of the change of the interlock value between the temperature $T_1$ and the temperature $T_2$.

In other words, the interlock value changes in accordance with the temperature within a range of a certain temperature and below in the graph 200. Specifically, the interlock value increases in the range of the certain temperature and below in accordance with the decrease in temperature in the graph 200.

In the below explanation, specific numerical values on the horizontal and vertical axes of the graph 200 will be dealt with. On the graph 200, the values of the horizontal axis are determined as $\{T_0, T_1, T_2\}=\{20, 25, 32\}$, and the values of the vertical axis are determined as $\{IL_0, IL_1, IL_2, IL_3\}=\{0, 2.0, 4.0, 5.4\}$. The graph 200 decreases from 5.4 W/kg to 2.0 W/kg between 20° C. and 32° C. in an approximately linear fashion. Specifically, the graph 200 decreases linearly from 5.4 W/kg to 4.0 W/kg between 20° C. and 25° C., and linearly from 4.0 W/kg to 2.0 W/kg between 25° C. and 32° C. For the temperature of 32° C. and above, the graph 200 stays constant at 2.0 W/kg. For the temperature of $T_0$ and below, the graph 200 may keep the linear relationship between $T_0$ and $T_1$.

That is, the interlock value varies in accordance with the temperature in the range of 25° C. or below in the graph 200. The interlock value increases in the range of 25° C. or below in accordance with the decrease in temperature in the graph 200. Alternatively, the interlock value increases in proportion to the decreasing temperature in the range of 25° C. or below in the graph 200.

Figure 3:
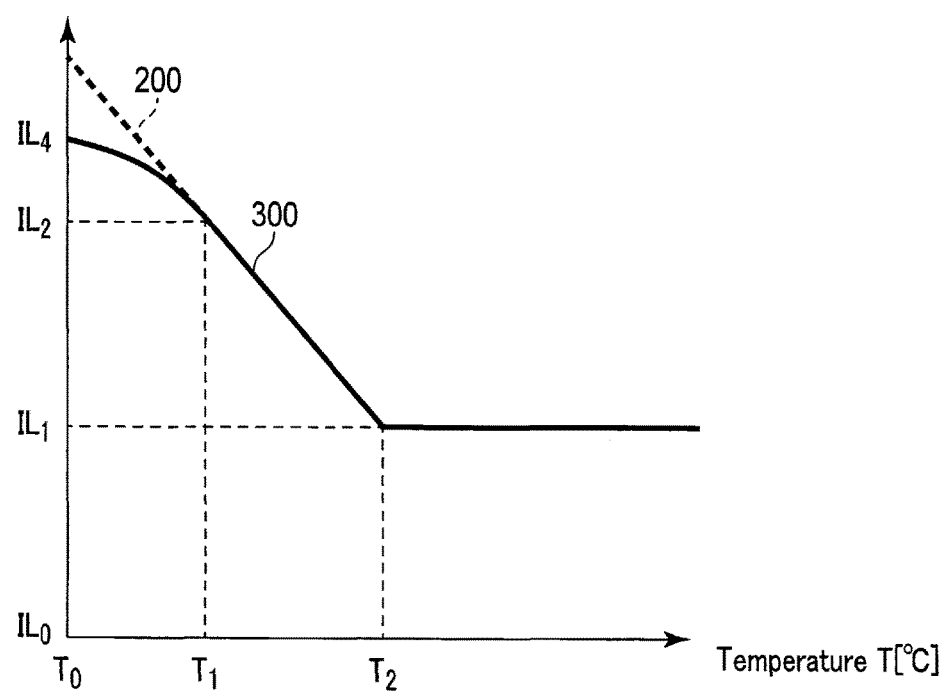
FIG. 3 is a graph showing another example of a relationship between the temperature and the interlock value according to the first embodiment.

FIG. 3 is a graph showing an example of a relationship between the temperature and the interlock value according to the first embodiment. As indicated in FIG. 3, the horizontal axis of the graph 300 indicates the temperature [° C.], while the vertical axis of the graph 300 indicates the interlock value [W/kg]. The graph 300 differs from the graph 200 in that the change of the interlock value is non-linear between the temperature $T_0$ and temperature $T_1$. The graph 300 is convexly curved from the interlock value $IL_4$ to the interlock value $IL_2$ between the temperature $T_0$ and temperature $T_1$.

The correspondence table stored in the storage 127 may be prepared based on the graph of FIG. 2 or the graph of FIG. 3. Alternatively, the mathematical expressions stored in the storage 127 may be formulated to satisfy the graph of FIG. 2 or the graph of FIG. 3.

The storage 127 may be, for example, a random access memory (RAM), a semiconductor memory device such as a flash memory, a hard disk drive, a solid state drive, and an optical disk. The storage 127 may be a driving device that reads and writes various information with respect to a portable storage medium such as a CD-ROM drive, DVD drive, and flash memory.

The temperature sensor 129 is a thermometer that measures the temperature. The temperature sensor 129 measures the temperature relating to an MRI examination. The temperature sensor 129 outputs the measured temperature as thermal information to the processing circuitry 131. The temperature sensor 129 may be a contact thermometer such as a thermistor thermometer and thermocouple thermometer, or a non-contact thermometer such as an infrared thermometer and fiber-optic thermometer. The phrase "relating to an MRI examination" includes at least "prior to the MRI examination", and may also include "during the MRI examination". The measured temperature may be interpreted as "ambient temperature".

The temperature sensor 129 is arranged in an area in which heating parts of the MRI apparatus 100 are concentrated. The heating parts include, for example, a balun and decoupling switch in the internal circuit of the transmission coil 115. The temperature sensor 129 may be arranged inside the transmission coil 115. When the transmission coil 115 is a WB coil, the temperature sensor 129 is arranged inside the WB coil, at a position near the center of the spiral coil pattern of the gradient coil 103. A large amount of heat is generated at the center of the gradient coil 103 causing the temperature to easily increase. This makes the center a suitable position for the measurement.

The temperature sensor 129 may be arranged in the space (patient space) where the subject is positioned during an MRI examination. In particular, the temperature sensor 129 may be arranged at any position of the wall surface that forms the bore 111. The temperature sensor 129 may be arranged underneath the rails that guide the table top 107a. The temperature sensor 129 may be arranged near the opening of the bore 111.

Alternatively, the temperature sensor 129 may be arranged in the shielded room for conducting an MRI examination. In particular, the temperature sensor 129 may be arranged on any surface of the MRI apparatus 100, in the vicinity of the MRI apparatus 100 or on the outer wall of the shielded room.

In view of the above, the temperature sensor 129 may be arranged at any position, whether inside or outside the MRI apparatus 100, as long as it does not affect the MRI examination and lies inside the shielded room for the MRI examination. The temperature sensor 129 may be arranged at multiple positions. When a plurality of temperature sensors 129 are arranged at a plurality of positions, thermometers of the same measurement type may be adopted for the temperature sensors 129; or thermometers having different measurement types may be adopted.

The processing circuitry 131 includes, as hardware resources, a processor (not shown) and memories such as a read-only memory (ROM) and RAM, and it controls the MRI apparatus 100. The processing circuitry 131 is provided with a system control function 131a, an image generation function 131b, a temperature acquisition function 131c, an interlock value determination function 131d and a parameter adjustment function 131e. The functions including the system control function 131a, image generation function 131b, temperature acquisition function 131c, interlock value determination function 131d and parameter adjustment function 131e are stored in the storage 127 in the form of computer-executable programs. The processing circuitry 131 is a processor that reads the programs corresponding to these functions from the storage 127 and implements the programs, realizing the functions corresponding to the programs. In other words, the processing circuitry 131 that reads the programs obtains the functions as indicated under the processing circuitry 131 in FIG. 1.

FIG. 1 has been explained as realizing the aforementioned functions at a sole processing circuitry 131. However, the functions may be realized by a plurality of independent processors implementing the programs. That is, the functions may be prepared as programs so that the programs can be implemented by a sole set of processing circuitry, or each of the functions can be implemented by an independent program implementing circuit dedicated to the function.

The term "processor" used in the above description may denote Central Processing Unit (CPU), Graphics Processing Unit (GPU), or any circuit such as Application Specific Integrated Circuit (ASIC) and Programmable Logic Device (e.g., Simple Programmable Logic Device (SPLD), Complex Programmable Logic Device (CPLD), and Field Programmable Gate Array (FPGA)).

The processor realizes the functions by reading and implementing the programs stored in the storage 127. Instead of storing the programs in the storage 127, the programs may be directly incorporated into the circuit of the processor. If this is the case, the processor realizes the functions by reading and implementing the programs incorporated in the circuit. Similarly, the table control circuitry 109, transmission circuitry 113, reception circuitry 119, and imaging control circuitry 121 are also constituted by the above processors or any electronic circuits. The system control function 131*a*, image generation function 131*b*, temperature acquisition function 131*c*, interlock value determination function 131*d* and parameter adjustment function 131*e* of the processing circuitry 131 are examples of a system controller, image generation unit, acquisition unit, determination unit and adjustment unit, respectively.

The processing circuitry 131 controls the MRI apparatus through the system control function 131*a*. Specifically, the processing circuitry 131 reads a system control program stored in the storage 127 and expands it on the memory, and controls the circuits of the MRI apparatus 100 in accordance with the expanded system control program. The processing circuitry 131 may read an imaging protocol from the storage 127 through the system control function 131*a*, based on the imaging conditions that are input from the interface 123 by the user. The processing circuitry 131 may generate the imaging protocol based on the imaging conditions. The processing circuitry 131 transmits the imaging protocol to the imaging control circuitry 121, and controls imaging on the subject P.

The processing circuitry 131 fills the k-space with MR data through the image generation function 131*b*. The processing circuitry 131 performs, for example, the Fourier transform on the MR data filled in the k-space to generate an MR image. The MR image may correspond to a morphological image relating to the subject P. The processing circuitry 131 outputs the MR image to the display 125 and the storage 127.

The processing circuitry 131 acquires the ambient temperature of the magnetic resonance imaging examination through the temperature acquisition function 131*c*. In particular, the processing circuitry 131 acquires the thermal information output from the temperature sensor 129. If the temperature during the MRI examination and MRI imaging increases in real time, the processing circuitry 131 may receive the ambient temperature in real time.

The processing circuitry 131 determines the interlock value of the SAR in accordance with the acquired ambient temperature through the interlock value determination function 131*d*. In particular, the processing circuitry 131 determines the interlock value corresponding to the acquired temperature, using the correspondence table read from the storage 127. Alternatively, the processing circuitry 131 determines (calculates) the interlock value corresponding to the acquired temperature, in accordance with the mathematical expression read from the storage 127. If the ambient temperature is acquired in real time, the processing circuitry 131 may determine the SAR-related interlock value in real time, in accordance with the ambient temperature acquired in real time.

For example, when a mathematical expression read from the storage 127 is used for the determination of the interlock value, the processing circuitry 131 may determine, through the interlock value determination function 131*d*, the interlock value in the range of the ambient temperature of $T_2$ (e.g., 25° C.) or below, using the mathematical function of the ambient temperature.

For example, if a correspondence table created based on the graph of FIG. 2 is used for the determination of an interlock value, the processing circuitry 131 may determine the interlock value so as to increase in the range of the ambient temperature of $T_2$ (e.g., 25° C.) or below in accordance with the decreasing ambient temperature, through the interlock value determination function 131*d*. Alternatively, the processing circuitry 131 may determine the interlock value so as to increase in proportion to the decreasing ambient temperature in the range of the ambient temperature of $T_2$ (e.g., 25° C.) or below.

The processing circuitry 131 adjusts the upper limit of the imaging parameter based on the determined interlock value through the parameter adjustment function 131*e*. In particular, prior to the MRI examination, the processing circuitry 131 adjusts the upper limit of the SAR-related imaging parameter based on the determined interlock value. During the MRI examination, the processing circuitry 131 adjusts the upper limit of the SAR-related imaging parameter to the determined interlock value in real time. Furthermore, during the MRI examination, the processing circuitry 131 may force the adjustment of the parameter value to the interlock value, or the termination of the MRI examination, if the value of the set parameter value exceeds the determined interlock value.

(Exemplary Process 1)

Figure 4:
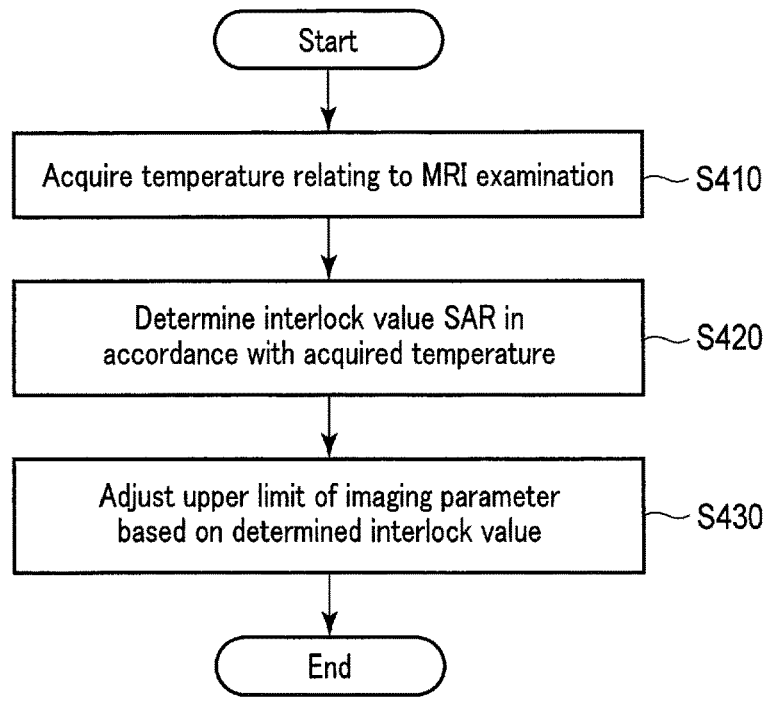
FIG. 4 is a flowchart of an exemplary process performed by processing circuitry according to the first embodiment.

FIG. 4 is a flowchart of an exemplary process performed by the processing circuitry according to the first embodiment. The process of FIG. 4 is initiated when the processing circuitry 131 implements a program for the determination of the SAR-related interlock value, for example, before the operator sets an imaging parameter through the interface 123, prior to the MRI examination.

(Step S410)

The processing circuitry 131 acquires the temperature relating to the MRI examination through the temperature acquisition function 131*c*. For example, the processing circuitry 131 acquires the thermal information of the temperature $T_1$ from the temperature sensor provided in the WB coil.

(Step S420)

The processing circuitry 131 determines the interlock value of the SAR in accordance with the acquired temperature through the interlock value determination function 131*d*. For example, the processing circuitry 131 determines the interlock value $IL_2$ corresponding to the temperature $T_1$, using the correspondence table prepared based on the graph of FIG. 2.

(Step S430)

The processing circuitry 131 adjusts the upper limit of the imaging parameter, based on the determined interlock value through the parameter adjustment function 131*e*. For example, the processing circuitry 131 may adjust the upper limit of the RF pulse-related parameter based on the interlock value $IL_2$.

(Exemplary Process 2)

Figure 5:
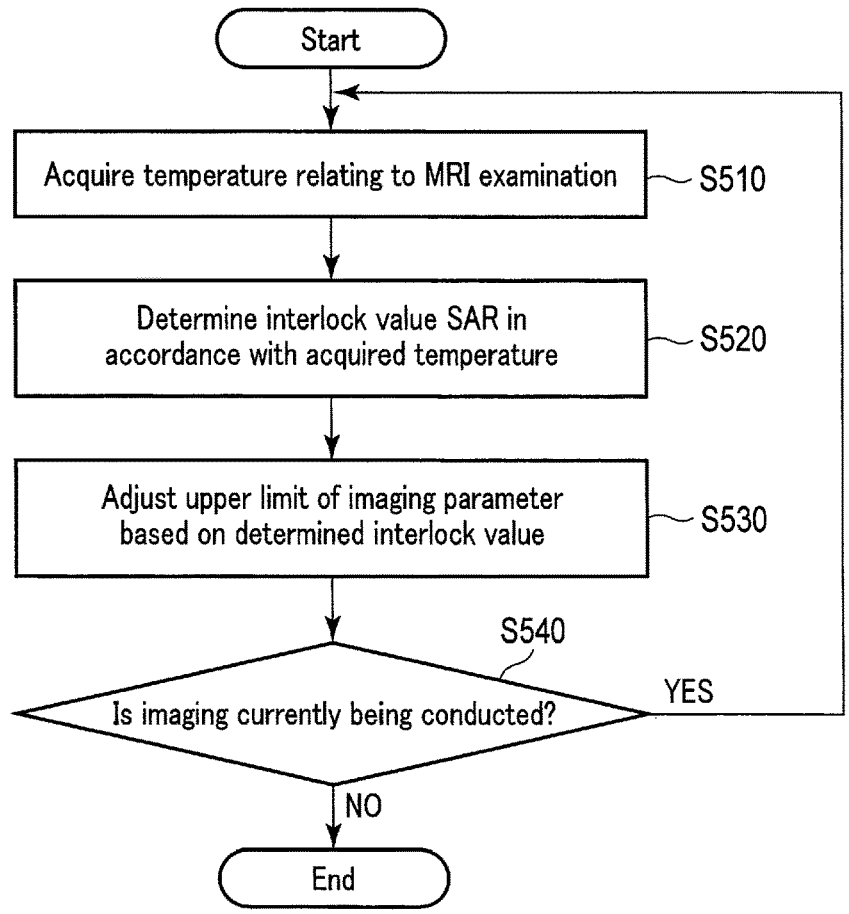
FIG. 5 is a flowchart of another exemplary process performed by the processing circuitry according to the first embodiment.

FIG. 5 is a flowchart of another exemplary process performed by the processing circuitry according to the first embodiment. The process of FIG. 5 may be initiated at a timing similar to the timing of initiating the process of FIG.

4. The processing circuitry 131 continues to execute the program for the determination of the SAR-related interlock value during the MRI examination until the imaging operation ends. The operations at steps S510, S520 and S530 are the same as those at steps S410, S420 and S430, respectively, and the explanation thereof is omitted.

(Step S540)

If the imaging is being conducted, the process returns to step S510. If the imaging is no longer being conducted, the process is terminated.

That is, during the imaging in the process of FIG. 5, the temperature is constantly being acquired, and the interlock value is being determined in accordance with the acquired temperature.

As discussed above, the MRI apparatus 100 according to the first embodiment acquires the ambient temperature, and determines the interlock value of the SAR in accordance with the acquired ambient temperature.

Furthermore, the MRI apparatus 100 according to the first embodiment realizes the determination of an interlock value in accordance with the ambient temperature.

In addition, the MRI apparatus 100 according to the first embodiment realizes the determination of an interlock value that varies in accordance with the temperature in the range of a certain temperature or below.

Furthermore, the MRI apparatus 100 according to the first embodiment acquires the ambient temperature in real time so that an interlock value can be determined in real time in accordance with the ambient temperature acquired in real time.

Furthermore, the MRI apparatus 100 according to the first embodiment determines the interlock value in accordance with the mathematical function of the ambient temperature when the ambient temperature is in the range of 25° C. or below.

The MRI apparatus 100 according to the first embodiment makes the determination in such a manner that the interlock value increases in accordance with a decrease in the ambient temperature when the ambient temperature is in the range of 25° C. or below.

The MRI apparatus 100 according to the first embodiment makes the determination in such a manner that the interlock value increases in proportion to the decreasing ambient temperature when the ambient temperature is in the range of 25° C. or below.

Accordingly, the MRI apparatus 100, which determines the SAR-related interlock value in accordance with the ambient temperature, can ensure the safety in conformity with the IEC standards, while allowing for flexible determination of imaging conditions. For instance, if an RF pulse of greater intensity than the conventional RF pulse is available owing to the determined interlock value, a higher-contrast image can be obtained in comparison to the conventional technique. Furthermore, if the determined interlock value is higher than the conventional interlock value, the length of imaging time can be shortened in comparison to the conventional technique when having the same flip angle. As a result, the TR time length can be shortened in comparison to the conventional technique, which can enhance the quality (e.g., contrast) of the T1 image. On the other hand, if the RF pulse has the same intensity and the same length of imaging time as the conventional RF pulse, the MRI apparatus 100 is allowed to irradiate the subject with a greater number, and wider variety, of RF pulses. Thus, it is now possible to adopt a pulse sequence that was previously unusable according to the conventional SAR standards.

Second Embodiment

Figure 6:
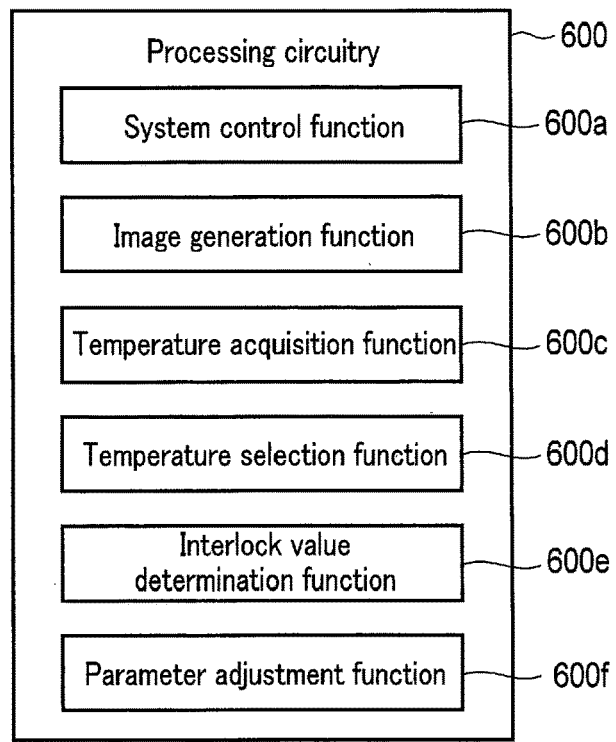
FIG. 6 is a diagram showing an exemplary configuration of the processing circuitry of the MRI apparatus according to the second embodiment.

FIG. 6 is a diagram showing the configuration of the processing circuitry of a magnetic resonance imaging apparatus according to the second embodiment. The magnetic resonance imaging apparatus according to the second embodiment can be differentiated from the magnetic resonance imaging apparatus according to the first embodiment by the configuration of the processing circuitry. In particular, the processing circuitry according to the second embodiment acquires a plurality of ambient temperatures, and determines the interlock value in accordance with the highest of the acquired ambient temperatures.

The processing circuitry 600 of FIG. 6 includes, as hardware resources, a processor (not shown) and memories such as a read-only memory (ROM) and RAM, and controls the MRI apparatus 100. The processing circuitry 600 is provided with a system control function 600*a*, an image generation function 600*b*, a temperature acquisition function 600*c*, a temperature selection function 600*d*, an interlock value determination function 600*e* and a parameter adjustment function 600*f*. The functions including the system control function 600*a*, image generation function 600*b*, temperature acquisition function 600*c*, temperature selection function 600*d*, interlock value determination function 600*e* and parameter adjustment function 600*f* are stored in the storage 127 in the form of computer-executable programs. The processing circuitry 600 is a processor that reads from the storage 127 and implements the programs corresponding to these functions, and thereby realizes the functions corresponding to the programs. In other words, the program-reading processing circuitry 600 obtains the functions as indicated under the processing circuitry 600 in FIG. 6.

The system control function 600*a*, image generation function 600*b*, temperature acquisition function 600*c*, temperature selection function 600*d*, interlock value determination function 600*e* and parameter adjustment function 600*f* of the processing circuitry 600 are examples of a system controller, image generation unit, acquisition unit, selection unit, determination unit and adjustment unit, respectively. The system control function 600*a*, image generation function 600*b*, and parameter adjustment function 600*f* are similar to the system control function 131*a*, image generation function 131*b* and parameter adjustment function 131*e*, and the explanation thereof is omitted.

The processing circuitry 600 acquires a plurality of ambient temperatures through the temperature acquisition function 600*c*. In particular, the processing circuitry 131 acquires plural sets of thermal information that are output individually from the temperature sensors 129 through the temperature acquisition function 600*c*.

The processing circuitry 600 selects the highest of the acquired ambient temperatures through the temperature selection function 600*d*.

The processing circuitry 600 determines the SAR-related interlock value based on the selected temperature through the interlock value determination function 600*e*. The procedure for determining the interlock value is the same as the interlock value determination function 131*d* of the processing circuitry 131, and the explanation thereof is omitted.

Figure 7:
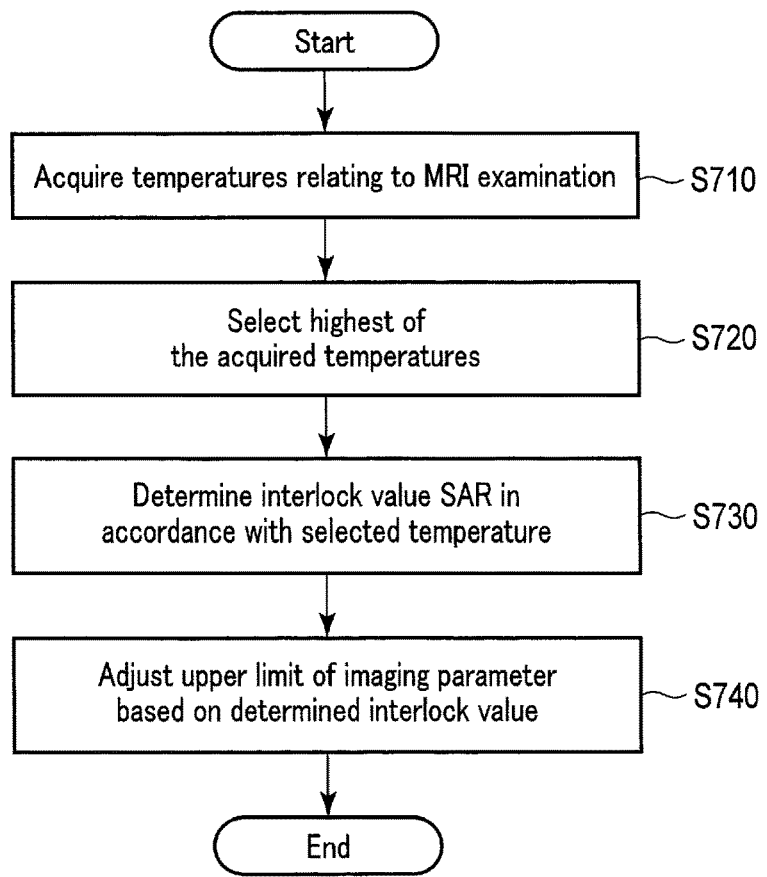
FIG. 7 is a flowchart of the process performed by the processing circuitry according to the second embodiment.

FIG. 7 is a flowchart of an exemplary process performed by the processing circuitry according to the second embodiment. Prior to the MRI examination, for example, the process of FIG. 7 is initiated when the processing circuitry 600 implements a program for the determination of the SAR-related interlock value before the operator sets an imaging parameter through the interface 123.

The process performed with the arrangement of a plurality of temperature sensors 129 inside the transmission coil and in the bore 111 and shielded room will be discussed as an exemplary process of FIG. 7.

(Step S710)

The processing circuitry 600 acquires the temperatures relating to the MRI examination through the temperature acquisition function 600c. The temperatures, which are output from the temperature sensors 129 provided inside the transmission coil and in the bore ill and shielded room, form a plurality sets of thermal information.

(Step S720)

The processing circuitry 600 selects the highest of the acquired temperatures through the temperature selection function 600d. For example, the processing circuitry 600 selects the temperature inside the transmission coil as the highest temperature.

(Step S730)

The processing circuitry 600 determines the interlock value of the SAR in accordance with the selected temperature through the interlock value determination function 600e.

(Step S740)

The processing circuitry 600 adjusts the upper limit of the imaging parameter based on the determined interlock value through the parameter adjustment function 600f.

As discussed above, the MRI apparatus according to the second embodiment acquires a plurality of ambient temperatures, selects the highest of the acquired ambient temperatures, and determines the interlock value of the SAR in accordance with the selected temperature.

In this manner, the MRI apparatus according to the second embodiment, which determines the interlock value in consideration of a plurality of ambient temperatures, is able to enhance safety.

Application Example

In the above explanation of the MRI apparatus according to the first and second embodiments, when determining the SAR-related interlock value in accordance with the ambient temperature, the temperature and the interlock value correspond directly to each other. In contrast, in this application example, the interlock value is determined by adding a correction value that is determined based on the temperature to a preset reference value. In the following description, the "processing circuitry and interlock value determination function" correspond to the "processing circuitry 131 and interlock value determination function 131d" or "processing circuitry 600 and interlock value determination function 600e". The remaining structure is essentially the same as the MRI apparatus of the first and second embodiments.

In the application example, the processing circuitry determines the interlock value of the SAR in accordance with the acquired ambient temperature through the interlock value determination function. In particular, the processing circuitry determines the interlock value corresponding to the acquired temperature, using a mathematical expression read from the storage 127. The mathematical expression may be expressed as in Equation (1) below.

$$IL_C = V_S + f(T_M) \qquad (1)$$

In this equation, $IL_C$ denotes an interlock value, $V_S$ denotes a preset reference value, $T_M$ denotes an ambient temperature (acquired temperature), and $f(T_M)$ denotes a function that is dependent on the acquired temperature. The preset reference value may be an upper limit defined by the IEC standards or the like. Function $f(T_M)$ may be expressed as in Equation (2) below.

$$f(T_M) = (T_B - T_M) \times \alpha \qquad (2)$$

In this equation, $T_B$ denotes the temperature of the subject, and a denotes a value determined for each apparatus (coefficient of the apparatus) in such a manner as to be calibrated. The value of the function $f(T_M)$ may be referred to as a "correction" value, based on the relationship between the reference value $V_S$ and interlock value $IL_C$ as expressed in Equation (1). For $T_B$, the average temperature of the subject may be adopted as the fixed value (e.g., 36° C.).

In summary, the processing circuitry determines the interlock value by adding a correction value based on the ambient temperature, to a preset reference value.

As described above, the MRI apparatus according to the application example can determine the interlock value by adding a correction value based on the ambient temperature to a preset reference value.

The MRI apparatus according to the application example, which adds a correction value to a reference value determined in the interlock scheme of the existing system, is easily applicable to the existing system, and allows for calibration in the applied system.

According to at least one of the aforementioned embodiments, the SAR-related interlock value can be determined in accordance with the ambient temperature.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising: processing circuitry configured to:
   acquire an ambient temperature relatingto a magnetic resonance imaging examination;
   determine an interlock value of a specificabsorption rate (SAR) in a non-linearly increasing manner in accordance with a decrease in the ambient temperature within an ambient temperature range between 20° C. and 25° C.; and
   perform an imaging protocol with the determined interlock value.

2. The apparatus according to claim 1, wherein the processing circuitry is further configured to:
   acquire the ambient temperature in real time; and
   determine the interlock value in real time in accordance with the ambient temperature acquired in real time.

3. The apparatus according to claim 1, wherein the processing circuitry is further configured to determine the interlock value by adding a correction value which is determined based on the ambient temperature, to a preset reference value.

4. The apparatus according to claim 1, further comprising a transmission coil configured to transmit an RF pulse,
   wherein the processing circuitry is further configured to acquire a temperature of an interior of the transmission coil as the ambient temperature.

5. The apparatus according to claim 4, wherein the transmission coil is a whole body coil.

6. The apparatus according to claim 1, wherein the processing circuitry is further configured to acquire a temperature inside a bore, into which a subject is transported, as the ambient temperature.

7. The apparatus according to claim 1, wherein the processing circuitry is further configured to acquire a temperature inside a shielded room, as the ambient temperature.

8. The apparatus according to claim 1, wherein the ambient temperature is a highest of a plurality of ambient temperatures including a temperature of an interior of a transmission coil, a temperature inside a bore into which a subject is transported, and a temperature inside a shielded room.

9. The apparatus according to claim 8, wherein the processing circuitry is further configured to:
   acquire the plurality of ambient temperatures;
   select as a selected temperature the highest of the plurality of ambient temperatures; and
   determine the interlock value in accordance with the selected temperature.

\* \* \* \* \*